(12) United States Patent
Wedowski et al.

(10) Patent No.: US 8,164,077 B2
(45) Date of Patent: *Apr. 24, 2012

(54) OPTICAL ELEMENT FOR RADIATION IN THE EUV AND/OR SOFT X-RAY REGION AND AN OPTICAL SYSTEM WITH AT LEAST ONE OPTICAL ELEMENT

(75) Inventors: Marco Wedowski, Aalen (DE); Nadyeh Shariloo, legal representative, Aalen (DE); Markus Weiss, Aalen (DE); Stephan Muellender, Aalen (DE); Johann Trenkler, Schwaebisch Gmuend (DE); Hartmut Enkisch, Aalen (DE); Gisela Sipos, Oberkochen (DE); Hubert Adriaan van Mierlo, Maassluis (NL); Michiel David Nijkerk, Amsterdam (NL); Fokko Pieter Wieringa, Elst (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 162 days.

This patent is subject to a terminal disclaimer.

(21) Appl. No.: 12/625,336

(22) Filed: Nov. 24, 2009

(65) Prior Publication Data

US 2010/0067653 A1  Mar. 18, 2010

Related U.S. Application Data

(63) Continuation of application No. 11/439,854, filed on May 24, 2006, now Pat. No. 7,646,004.

(60) Provisional application No. 60/683,879, filed on May 24, 2005.

(51) Int. Cl.
*G01J 3/10* (2006.01)

(52) U.S. Cl. ......... 250/504 R; 250/372; 378/35
(58) Field of Classification Search ......... 250/504 R
See application file for complete search history.

(56) References Cited

U.S. PATENT DOCUMENTS

| | | | |
|---|---|---|---|
| 5,311,098 A * | 5/1994 | Seely et al. | 313/542 |
| 6,198,793 B1 | 3/2001 | Schultz et al. | |
| 6,600,552 B2 | 7/2003 | Dinger | |
| 6,642,531 B1 * | 11/2003 | Powers | 250/492.2 |
| 6,656,575 B2 | 12/2003 | Bijkerk et al. | |
| 6,681,063 B1 * | 1/2004 | Kane et al. | 385/18 |
| 7,099,084 B2 * | 8/2006 | Bi | 359/565 |
| 7,646,004 B2 * | 1/2010 | Wedowski et al. | 250/504 R |

FOREIGN PATENT DOCUMENTS

| | | |
|---|---|---|
| DE | 10016008 | 10/2001 |
| DE | 102 21 116 B3 | 2/2004 |
| EP | 1 431 828 A | 6/2004 |
| JP | 2003124111 | 4/2003 |
| WO | 2005031748 | 8/2003 |
| WO | 2004 107055 A | 12/2004 |

* cited by examiner

*Primary Examiner* — Phillip A Johnston
(74) *Attorney, Agent, or Firm* — Sughrue Mion, PLLC

(57) ABSTRACT

An optical element, especially a normal-incidence collector mirror, for radiation in the EUV and/or soft X-ray region of wavelengths is described. The element has a substrate, a multilayer coating with an optically active region, and a capacitor, having a first and a second capacitor electrode. At least one layer of the multilayer coating serves as the first capacitor electrode. At least one dielectric layer is provided between the two capacitor electrodes. Also described is an optical system with at least one optical element, having a first electrode arranged in the vicinity of the optical element.

33 Claims, 4 Drawing Sheets

OPTICAL ELEMENT FOR RADIATION IN THE EUV AND/OR SOFT X-RAY REGION AND AN OPTICAL SYSTEM WITH AT LEAST ONE OPTICAL ELEMENT

CROSS-REFERENCE TO RELATED APPLICATION

This application is a Continuation of U.S. patent application Ser. No. 11/439,854, filed on May 24, 2006, which claims the priority of U.S. Provisional Application No. 60/683,879, filed on May 24, 2005 in the U.S. Patent and Trademark Office, the disclosures of which are incorporated herein by reference in their entirety.

FIELD OF THE INVENTION

The invention concerns an optical element for radiation in the EUV and/or soft X-ray region of wavelengths with a substrate and with a multilayer coating deposited on the substrate with an outer surface turned toward the incident radiation, having an optically active region. The invention also pertains to a normal-incidence collector mirror and to an optical system with at least one such optical element.

BACKGROUND OF THE INVENTION

One of the main problems of lithography with EUV radiation or soft X-rays (wavelengths between, e.g., 1 and 20 nm) is the contamination of the optical elements on a molecular level, especially that of the multilayer mirrors used in lithography devices, such as are known, for example, from DE 100 16 008. This surface degradation leads to reflectivity losses and imaging errors. There are basically two prevailing processes. One process consists of oxidation of the surface, during which the surface becomes irreversibly destroyed. The other process consists in the build-up of carbon. This second process is reversible.

The degradation of the surface can be caused, among other things, by ions or electrons striking the surface of the optical element. The ions are produced by photoionization of the residual gas atmosphere or the gases introduced for cleaning purposes by the EUV radiation and the soft X-rays. The electrons usually involve secondary electrons escaping under exposure to the radiation.

The problem of surface degradation by charged particles is further intensified when electrical fields are applied in the region of the optical elements by means of electrodes or grids for monitoring and/or cleaning purposes. A more intense degradation occurs under the resulting bombardment with ions or electrons (depending on the orientation of the electric field).

The problem of surface degradation is furthermore intensified when the optical element is used with pulsed EUV radiation or soft X-rays. During each pulse of radiation, the mirror surface takes on positive charge, since secondary electrons are induced. In particular, when electric fields are applied in the region of the optical elements, the optical elements will be adversely influenced. Furthermore, the steepness of the edges of the EUV pulses, which lies on the order of magnitude of 10 to 100 ns, can lead to electromagnetic effects, which can have a detrimental impact on the overall layout in which the optical element is being used.

It is suspected that the charge carriers in nongrounded optical elements on account of the electrical potential created by their escaping from the surface will fall back onto the surface of the optical element.

From JP 2003124111 A, an optical element with a multilayer coating is known. The secondary electrons arising during the radiation exposure, with an energy of 100 eV, can strike against neighboring optical elements and affect them. In order to intercept these secondary electrons, this known optical element can be grounded, or a potential difference can be imposed between the optical element and the wall of the housing, the wall being connected to the positive pole of a voltage source, and one layer of the multilayer is connected to the negative pole.

However, it has been found that, in addition to the photoelectrons in the range of 100 eV, lower-energy secondary electrons also occur in the region of 10 eV, making up the larger portion of the secondary electrons, and they cannot be caught quickly enough with such an electrode arrangement.

Another problem lies in that, when the multilayer coating is grounded in the traditional way, the escaping secondary electrons cannot be replaced fast enough, which may result in an increasing positive charging of the optical element.

SUMMARY OF THE INVENTION

It is therefore the goal of the invention to provide an optical element or an optical system with at least one optical element with which, on the one hand, lower energy secondary electrons are caught, and on the other hand the positive charging of the optical element is prevented.

This goal is accomplished with an optical element according to the claims. The optical element has a capacitor, containing a first and a second capacitor electrode, wherein at least one layer of the multilayer coating is hooked up as the first capacitor electrode and the second capacitor electrode is preferably arranged outside the optically active region on the outer surface of the multilayer coating, and at least one dielectric layer is provided between the second capacitor electrode and the outer surface.

The capacitor is part of the optical element or it is integrated in the optical element. This capacitive element arranged directly on the optical element has the advantage that the at least one layer of the multilayer coating can be supplied with electrons in a short time when the multilayer coating is positively charged by the escaping of the secondary electrons.

The multilayer coating, for example, can consist of a stack of Mo—Si layers, of which at least one layer, which can also be the outer layer, is hooked up as the first capacitor electrode. The multilayer coating can be closed off, e.g., by a protective layer against the vacuum, consisting of one or more materials of the group of Ce, Be, SiO, SiC, $SiO_2$, $Si_2N_4$, C, Y, $MoSi_2$, B, $Y_2O_3$, $MoS_2$, $B_4C$, BN, $Ru_xSiy$, Zr, Nb, MoC, $ZrO_2$, $Ru_xMoy$, $Rh_xMoy$, $Rh_xSiy$.

Additional multilayer coatings can be constructed as follows:

Mo—B4C—Si

Mo—$Mo_xSiy$-Si

The dielectric layer can consist, for example, of $SiO_2$, $Al_2O_3$, or $Ta_2O_5$.

Preferably, the second capacitor electrode consists of C, Ge, Co, W, Ta, Mo, Ni, Cr, V, Ti, Ir, Ru, Au, Pt and/or Rh and/or their compounds, mixtures and/or alloys. Especially preferred are Au, Pt, Ru and Rh.

The at least one dielectric layer and the second capacitor electrode arranged thereon can be shaped in the form of a ring. One such capacitor ring encloses the optically active region of the outer surface of the multilayer coating. Preferred thicknesses and widths of such a capacitor ring on the outer surface of the multilayer coating are: thickness 0.1-50 pm, width 0.1-50 mm.

The capacitance C of the capacitor is preferably S 500 nF, especially 150-400 nF, particularly 250-350 nF.

The time constant of the capacitor is preferably 10 ps, especially 0.1 to 10 μs, especially 0.5-1.5, especially 1 μs.

Especially when the optical element is used with pulsed radiation, a capacitor is preferred with a time constant that ensures that a discharging of the optical element can occur between two pulses. Therefore, for radiation pulses in the Megahertz range, time constants <1 μs work well.

At least one lead wire is provided to the capacitor electrodes, preferably consisting of a so-called "flex foil". These so-called "flex foils" are characterized in being 0.5-5 cm in width, preferably 1 cm in width, and they have a thickness of 0.05-0.5 mm, preferably 0.1 mm. The "flex foils" make use of the skin effect. At high frequencies, the ohmic resistance remains constant. Very low time constants can be achieved.

The lead wire preferably has an inductance <5 μH. Especially when using pulsed radiation, it has proven to be beneficial for the lead wire to have a low inductance, which leads to a faster response function of the capacitor, so that the fastest possible discharge can occur.

The lead wire preferably has an ohmic resistance <100 mΩ. It has been found beneficial for the lead wire to have a low resistance overall, because the replenishment of the electrons can then occur as fast as possible.

Preferably, the optical element has a voltage source that is hooked up preferably between the capacitor electrodes.

Preferably at least one capacitor electrode is connected to a switching device, by which the capacitor electrode can be placed at ground, positive potential, or negative potential. By means of the switching device, the capacitor can be set at any desired potential, which is especially advantageous when the optical element is combined with additional electrodes for the intercepting of positively charged ions or higher-energy secondary electrons.

Preferably the switching device is connected to a control unit, which may have a time switch. In this way, it is possible to perform switching at regular time intervals.

Between the capacitor electrode and the switching device, at least one measuring device can be arranged. This can be, for example, a current measuring device, in order to measure the current of the captured secondary electrons, or a voltage measuring device.

One or more optical elements according to the invention can be assembled into an optical system, suitable, for example, for illuminating or projecting, especially of structures being mapped. The optical systems can be used to make lithography machines. With the help of such lithography machines, components can be produced by lithography, using at least one optical element or optical system and EUV radiation or soft X-rays to map structures onto a substrate.

The optical system is characterized by at least one optical element with capacitor and by at least one electrode, which is arranged in the vicinity of the optical element. Thanks to the first electrode arranged in the vicinity of the optical element, it is possible to intercept rather high-energy secondary electrodes, e.g., those with 100 eV, or also positively charged ions, depending on the established potential.

The first electrode is preferably a plate, ring or grid arranged in the vicinity of the optical element.

There can also be provided a second electrode, which is preferably arranged at a further spatial distance from the optical element than the first electrode. Thanks to the combination of at least two electrodes, i.e., at least a first and at least a second electrode, the volume in which a strong electric field exists will be reduced. This also reduces the probability of unwanted effects occurring by virtue of the electric field.

Preferably, the second electrode is a housing surrounding the optical element and the first electrode is a grid, plate or ring arranged in the vicinity of the optical element.

The first and/or second electrode also possess lead wires in the form of "flex foils". The first and/or second electrode can each be connected to a switching device, by which the electrodes can be placed at ground, positive potential or negative potential. The switching devices can be connected to a control unit. At least one measuring device can be provided between the respective electrode and the switching device.

The optical element(s) are, as mentioned at the outset, mirrors, for example, with a multilayer coating. This includes, in particular, "normal-incidence" collector mirrors, such as those described in WO 2005/031748 AI, whose content is taken up fully in the present application. Such collector mirrors likewise have a multilayer coating to improve the reflection properties. Since they are arranged, of course, especially close to the radiation source, they are also exposed to a correspondingly large risk of contamination. Therefore, the capacitor arrangement of the invention is especially preferable for use with such collector mirrors as well.

BRIEF DESCRIPTION OF THE DRAWINGS

Sample embodiments of the invention shall be explained more closely hereafter by means of the drawings. These show.

DETAILED DESCRIPTION OF THE INVENTION

Figure 1:
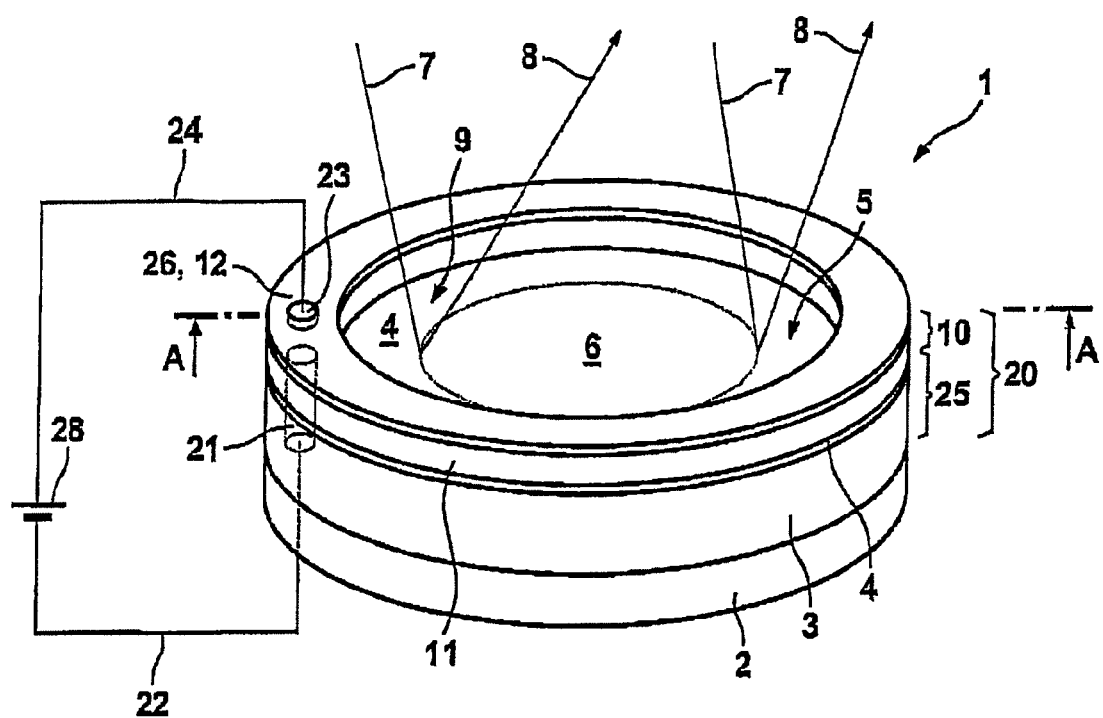
FIG. 1, a perspective representation of the optical element.

FIG. 1 shows an optical element 1, having a substrate 2, on which is placed a multilayer coating in the form of a multilayer pack 3. On this multilayer pack 3 is provided a protective layer (cap layer) 4, forming the outer surface of the optical element.

On the surface 5 of the protective layer 4 is arranged a capacitor ring 10, consisting of a dielectric layer 11 and an electrically conducting layer 12. This capacitor ring 10 encloses the optically active surface 6, which is defined by the beam geometry, as it is characterized by the schematically represented incident rays 7 and reflected rays 8. The annular margin region between optically active surface 6 and the capacitor ring 10 is the optically inactive surface 9.

The multilayer pack 3 with the protective layer 4 forms the first capacitor electrode 25. The electrically conducting layer 12 forms the second capacitor electrode 26. Along with the dielectric layer 11, this forms the capacitor 20.

The first capacitor electrode 25 has a first contact element 21, which in the embodiment shown here extends through the multilayer pack 3 and the protective layer 4. The second capacitor electrode 26 has a second contact element 23, which is arranged inside the electrically conducting layer 12. These contact elements 21, 23 are connected via lead wires 22, 24 to a voltage source 28, these lead wires consisting of so-called flex foils. Here, the first contact element 21 is connected to the negative pole and the second contact element 23 to the positive pole of the voltage source 28.

Figure 2:
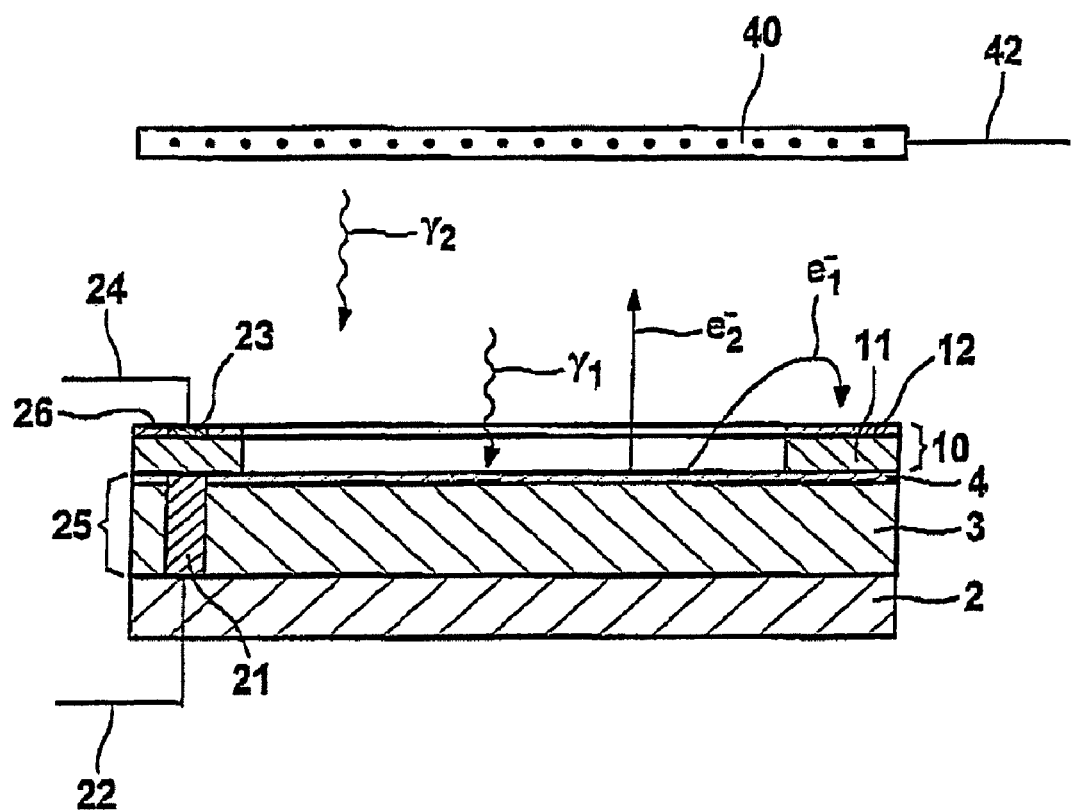
FIG. 2, a vertical cross section through the optical element shown in FIG. 1 along line A-A, together with a first electrode.

FIG. 2 shows a section through the optical element 1 per FIG. 1 along line A-A, showing a grid 40 in addition above the optical element 1, which is connected to a voltage source (not shown) by a lead wire 42, again in the form of a flex foil.

Photons ($y_i$, y2) strike the surface of the protective layer 4 one after the other, generating secondary electrons. The impact of the first photon y, can create both electrons e', with low energy (around 10 eV) and high-energy electrons e'2 (around 100 eV). These high-energy electrons $e'_2$, if the grid 40 lies at appropriately positive potential, will be captured by this grid and carried away by the lead wire 42. The low-energy electrons e'1 are attracted due to the fact that the second capacitor electrode, which is at positive potential relative to the first capacitor electrode 26. Due to the creation of the secondary electrons e'1 and e'2, the first capacitor electrode 25, especially the protective layer 4, becomes positively charged. The electrons needed to equalize the charge are brought up in very short time via the capacitor 20, so that the original voltage bias is restored, and thus the next photon y2 will encounter the same potentials on both capacitor electrodes 25, 26.

Figure 3:
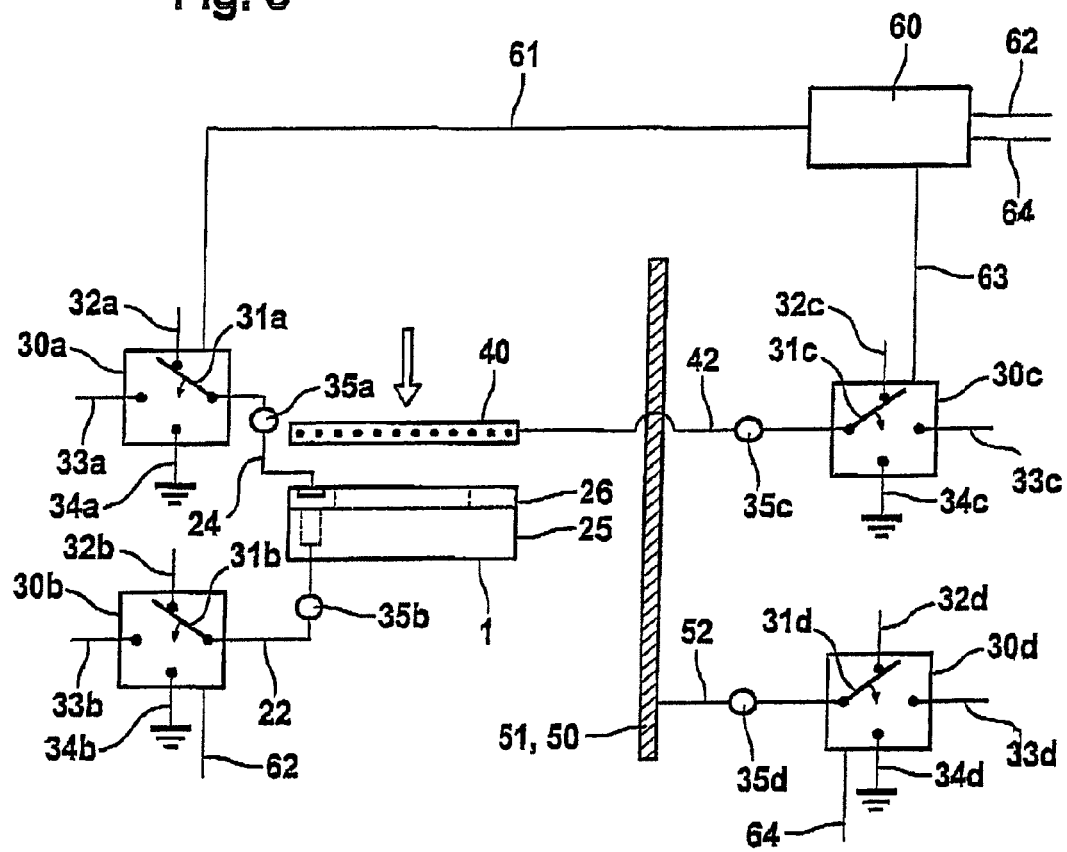
FIG. 3, an optical system in schematic representation.

FIG. 3 shows a schematic representation of an optical system. The first capacitor electrode 25 of the optical element 1 is connected by the lead wire 22 to a switch 30b, and a measuring device 35b is arranged between the optical element 1 and the switch 30b. The second capacitor electrode 26 is connected by the lead wire 24 to the switch 30a, and a measuring device 35a is likewise arranged in the lead wire 24.

Also the first electrode 40 is connected in the same way to a switch 30c and a measuring device 35c. A second electrode 50 in the form of the housing wall 51, only schematically indicated, is connected by a lead wire 52 to the switch 30d, and a measuring device 35d is provided in the lead wire 52. All lead wires consist of "flex foils".

Each switch makes it possible to set the system at ground, or a negative or positive potential, using the switching elements 31a, b, c, d. The different potentials are imposed on the leads 32a-d, 33a-d and 34a-d.

All switches 30a-d are connected by corresponding lead wires 61-64 to a control device 60. This makes possible a quick switching and, thus, a quick changing of potential on the individual components.

Figure 4:
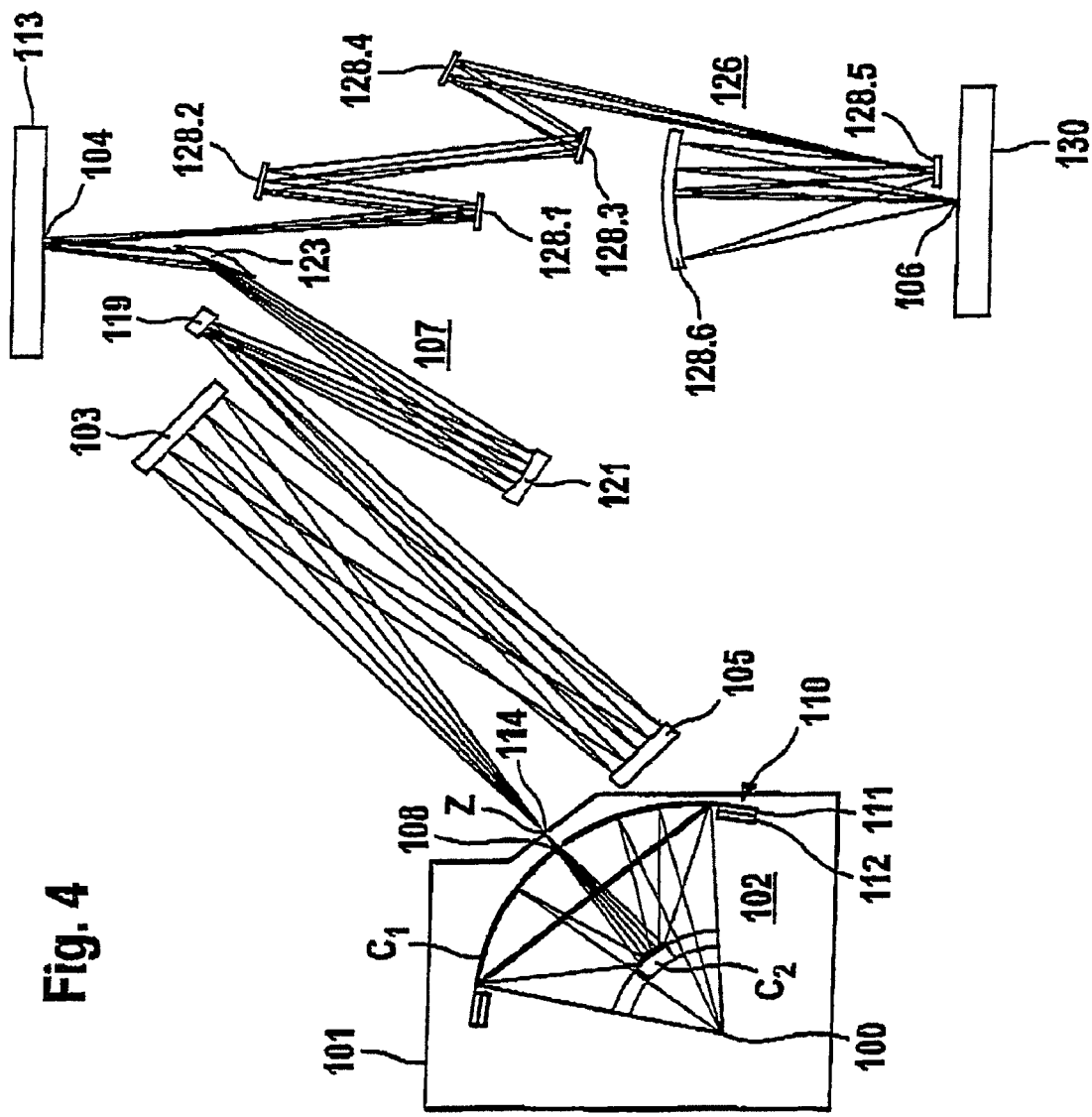
FIG. 4, the layout of a lithography system with a blacklight collector system, having two normal-incidence collector mirrors according to the invention.

FIG. 4 shows the typical layout of an EUV lithography system for microlithography, having a black light collector system 102.

The schematically simplified representation of the black light collector system 102 shows a first normal-incidence collector mirror CI according to the invention, which thanks to its concave, e.g., parabolic or elliptical configuration, takes up light from the light source 100 and reflects it onto the second normal-incidence collector mirror C2 according to the invention, which again can have a hyperbolic or ellipsoidal configuration. This second normal-incidence collector mirror C2 is arranged centered on the first normal-incidence collector mirror CI so that a symmetrical collector system is produced, which projects the light source 100 onto a magnified intermediate image Z. For the radiation exiting from the second normal-incidence collector mirror C2, a passageway 108 is made in the first normal-incidence collector mirror CI. Accordingly, light from the light source 100 is taken up by the first normal-incidence collector mirror CI with a first aperture angle and beamed to the second normal-incidence collector mirror C2 with a second aperture angle. The pencil of rays leaving the second normal-incidence collector mirror C2 is in turn associated with a third aperture angle. By aperture angle is meant, in the present application, the angle between the marginal ray of a pencil of rays with the maximum beam angle to the optical axis. The aperture angles at the same time define the optically active region of the collector mirrors CI and C2. Under the vacuum conditions prevailing during EUV irradiation, the numerical aperture then results from the sine of the aperture angle.

The collector mirror CI is constructed from a multilayer coating, like the optical element 1 from FIG. 1. As in that case, a capacitor ring 110 is located on a protective layer (not shown), consisting in turn of a dielectric layer 111 and an electrically conducting region 112. This capacitor ring 110 encloses the optically active surface of the collector, so that it is arranged completely outside of the first and second aperture angle, as is indicated by the schematically represented incident and reflected rays.

In similar fashion, the second normal-incidence collector mirror C2 is also provided with a multilayer coating and a capacitor ring arranged on its protective layer. For reasons of scale, neither of these is discernible in the figure. Once again, the capacitor ring of the collector C2 surrounds the optical surface defined by the beam geometry, so that neither the second nor the third aperture angle is affected by it.

Furthermore, FIG. 4 shows optical components of an illumination system in the light path proceeding from a light source 100 to an illuminated plane, known as the field plane 113, as well as the projection lens 126 of a projection illumination system.

The forming of an intermediate image Z of the light source 100 is advantageous, since it allows the light source 100 and the collector system 102 to be contained in a compartment atmospherically removed from the downstream system. Such a compartment is sketched in FIG. 4 and designated as 101. Furthermore, thanks to the forming of the intermediate image Z of the light source 100, it is possible to include a diaphragm 114 in the beam path, interacting with a grating type spectral filter, for example, for a spectral filtering of the illumination.

Furthermore, FIG. 4 shows the optical components of the illumination system that are arranged downstream from the invented collector system 102 in the light path from the light source 100 to the illuminated field plane 113, as well as the projection lens 126. Specifically, FIG. 4 shows: a reticle or mask 104 is positioned in the field plane 113 of a projection illumination system and projected by means of a reducing optics 126 onto its image plane 130, in which there is typically located a wafer 106 provided with a photosensitive material. FIG. 4 shows, for example, a projection lens consisting of six individual mirrors 128.1 to 128.6, as follows for example from U.S. Pat. No. 6,600,552, whose full content is taken up in the present application. Moreover, there is sketched an ideally telecentric illumination of the image plane 130, i.e., the principal ray of a pencil of rays, proceeding from a field point of the field plane 113, intersects the image plane 130 perpendicularly. Moreover, the projection lens 126 has an entry pupil, which generally coincides with the exit pupil of the illumination system.

FIG. 4 shows, moreover, the typical layout of an EUV illumination system, which is designed as a double-facetted lighting system per U.S. Pat. No. 6,198,793 B1, the content of this document being taken up fully into the present application. Such a system comprises a first optical element with first screen elements 103, also known as a field facet mirror 103. Coming next in the ray path is a second optical element with second screen elements 106, usually called a pupil facet mirror 106.

Field and pupil facet mirror 103, 105 serve to illuminate a field in the field plane 113, and also to form the illumination in the exit pupil of the illumination system. The action of each field honeycomb is such that it forms an image of the light source 100, and the plurality of field facets forms a plurality of so-called secondary light sources. The secondary light sources are formed in or near the plane in which the pupil facet mirror 105 is arranged. Since, as shown in FIG. 4, the secondary light sources come to lie in the region of the pupil facet mirror 105, the field facets themselves can have an optical effect, for example, a collecting optical effect. The optical elements further downstream will project these secondary light sources as a tertiary light source into the exit pupil of the illumination system.

Moreover, each field honeycomb will be projected into the field plane 113 by the facets of the pupil facet mirror 105 and the further downstream optical elements of the second optical component 107, which in the example of FIG. 4 consist of the three optical elements of the first reflective optical element 119, the second reflective optical element 121 and the grazing-incidence mirror 123. The images of the field facets which are superimposed here serve to illuminate a mask 104 in the field plane 113, and typically rectangular or arc-shaped field facets will produce an illumination in the field plane 113 in the form of a segment of an annular field. In general, the microlithography system is designed as a scanning system, so that the mask 104 in the field plane 113 and a wafer 106 in the image plane 130 move in synchronization to accomplish an illumination or an exposure.

LIST OF REFERENCE NUMBERS 1 optical element
2 substrate
3 multilayer pack
4 cap layer
5 surface of the cap layer
6 optically active surface
7 incident beam
8 reflected beam
9 optically inactive surface
10 capacitor ring
11 dielectric layer
12 electrically conducting layer
20 capacitor
21 first contact element
22 lead wire
23 second contact element
24 lead wire
25 first capacitor electrode
26 second capacitor electrode
30a-d switching device
31 a-d switch
32a-d positive potential lead
33a-d negative potential lead
34a-d mass lead
35a-d measuring device
40 grid
42 lead wire
50 second electrode
51 housing wall
52 lead wire
60 control device
61 connection wire
62 connection wire
63 connection wire
64 connection wire
100 light source
101 compartment for containing the light source 100 and the collector system 102
102 collector system
103 first optical element with first screen elements (field facet mirror)
104 mask carrying the structure
105 second optical element with first screen elements (pupil facet mirror)
106 wafer provided with a photosensitive material
107 second optical component
108 passageway in the first normal-incidence mirror
110 capacitor ring
111 dielectric layer
112 electrically conducting layer
113 field plane
114 diaphragm
119 first reflective optical element
121 second reflective optical element
123 grazing-incidence mirror
126 projection lens
128.1, 128.2, 128.3, 128.4, 128.5, 128.6 mirrors of the projection lens
130 image plane
CI first normal-incidence collector mirror
C2 second normal-incidence collector mirror

What is claimed is:

1. An optical element for radiation in at least one of the EUV wavelength region and the soft X-ray wavelength region, the optical element comprising:
    a substrate;
    a multilayer coating deposited on the substrate with an outer surface turned toward incident radiation, wherein the multilayer coating has an optically active region and reflects the incident radiation; and
    a capacitor comprising a first capacitor electrode and a second capacitor electrode,
    wherein at least one layer of the multilayer coating is connected as the first capacitor electrode,
    wherein at least one dielectric layer is provided between the first capacitor electrode and the second capacitor electrode, and
    wherein at least one of the capacitor electrodes is connected to a switching device, by which the at least one capacitor electrode is placed selectively at ground, positive potential, or negative potential.

2. The optical element according to claim 1, wherein the switching device is connected to a control unit.

3. The optical element according to claim 1, wherein at least one measuring device is arranged between the capacitor electrode connected to the switching device and the switching device for measuring current strength or voltage.

4. The optical element according to claim 1, wherein the second capacitor electrode and the dielectric layer are arranged outside the optically active region.

5. The optical element according to claim 1, wherein the dielectric layer and the second capacitor electrode are arranged on the outer surface of the multilayer coating.

6. The optical element according to claim 1, wherein the dielectric layer consists of $SiO_2$, $Al_2O_3$, or $Ta_2O_5$.

7. The optical element according to claim 1, wherein the second capacitor electrode consists of an element selected from the group consisting of C, Ge, Co, W, Ta, Mo, Ni, Cr, V, Ti, Ir, Ru, Au, Pt and Rh, or a compound, mixture or alloy including the element, or a combination thereof.

8. The optical element according to claim 1, wherein the at least one dielectric layer and the second capacitor electrode are shaped in the form of a ring.

9. The optical element according to claim 1, wherein the capacitance C of the capacitor is 150-400 nF.

10. The optical element according to claim 1, wherein the time constant of the capacitor is 0.1 to 10 µs.

11. The optical element according to claim 1, wherein at least one lead wire consisting of a flex foil is provided to the capacitor electrodes.

12. The optical element according to claim 11, wherein the lead wire has an inductance <5 µH.

13. The optical element according to claim 11, wherein the lead wire has an ohmic resistance <100 mΩ.

14. The optical element according to claim 1, further comprising a voltage source.

15. The optical element according to claim 1, wherein the optical element is a normal-incidence collector mirror.

16. An optical system comprising:
    at least one optical element comprising:
    a substrate;
    a multilayer coating deposited on the substrate with an outer surface turned toward incident radiation, wherein the multilayer coating has an optically active region and reflects the incident radiation; and
    a capacitor comprising a first capacitor electrode and a second capacitor electrode,
    wherein at least one layer of the multilayer coating is connected as the first capacitor electrode,
    wherein at least one dielectric layer is provided between the first capacitor electrode and the second capacitor electrode, and
    wherein at least one of the capacitor electrodes is connected to a switching device, by which the at least one capacitor electrode is placed selectively at ground, positive potential or negative potential; and
    at least a first electrode, which is arranged in the vicinity of the optical element.

17. The optical system according to claim 16, wherein the switching device is connected to a control unit.

18. The optical system according to claim 16, wherein at least one measuring device is provided between the capacitor electrode connected to the switching device and the switching device for measuring current strength or voltage.

19. The optical system according to claim 16, wherein the first electrode is a plate, ring or grid arranged in the vicinity of the optical element.

20. The optical system according to claim 16, wherein the first electrode is connected to a switching device, by which the first electrode can be placed at ground, positive potential or negative potential.

21. The optical system according to claim 20, wherein the switching device is connected to a control unit.

22. The optical system according to claim 20, wherein at least one measuring device is provided between the first electrode and the switching device for measuring current strength or voltage.

23. The optical system according to claim 16, further comprising at least one second electrode.

24. The optical system according to claim 23, wherein the second electrode is arranged at a further spatial distance from the optical element than the first electrode.

25. The optical system according to claim 23, wherein the second electrode is a housing wall surrounding the optical element and the first electrode is a grid, plate or ring arranged in the vicinity of the optical element.

26. The optical system according to claim 23, wherein at least one of the electrodes is connected to a switching device, by which the electrodes can be placed at ground, positive potential or negative potential.

27. The optical system according to claim 23, wherein at least one of the electrodes is connected to a switching device, by which the electrodes can be placed at ground, positive potential or negative potential and wherein the switching device is connected to a control unit.

28. The optical system according to claim 23, wherein at least one of the electrodes is connected to a switching device, by which the electrodes can be placed at ground, positive potential or negative potential and wherein at least one measuring device is provided between the electrode connected to the switching device and the switching device for measuring current strength or voltage.

29. The optical system according to claim 16, wherein lead wires of the electrodes consist of flex foils.

30. The optical system according to claim 16, wherein the optical element is a normal-incidence collector mirror.

31. A normal-incidence collector mirror for incident radiation in at least one of the EUV wavelength region and the soft X-ray wavelength region, the normal-incidence collector mirror comprising:
    a substrate;
    a multilayer coating deposited on the substrate with an outer surface turned toward the incident radiation, wherein the multilayer coating has an optically active region and reflects the incident radiation; and
    a capacitor comprising a first capacitor electrode and a second capacitor electrode,
    wherein at least one layer of the multilayer coating serves as the first capacitor electrode,
    wherein at least one dielectric layer is provided between the first capacitor electrode and the second capacitor electrode, and
    wherein at least one of the capacitor electrodes is connected to a switching device, by which the at least one capacitor electrode is placed selectively at ground, positive potential or negative potential.

32. The optical element according to claim 31, wherein the switching device connected to a control unit.

33. The optical element according to claim 31, wherein at least one measuring device is arranged between the capacitor electrode connected to the switching device and the switching device for measuring current strength or voltage.

* * * * *

UNITED STATES PATENT AND TRADEMARK OFFICE
CERTIFICATE OF CORRECTION

PATENT NO. : 8,164,077 B2
APPLICATION NO. : 12/625336
DATED : April 24, 2012
INVENTOR(S) : Marco Wedowski et al.

Page 1 of 1

It is certified that error appears in the above-identified patent and that said Letters Patent is hereby corrected as shown below:

Column 2, Line 50: delete "$Ru_xSiy$," and insert -- $Ru_xSi_y$, -- therefor and delete "$Ru_xMoy$," and insert -- $Ru_xMo_y$, -- therefor Column 2, Line 51: delete "$Rh_xMoy$," and insert -- $Rh_xMo_y$, -- therefor and delete "$Rh_xSiy$." and insert -- $Rh_xSi_y$. -- therefor Column 2, Line 55: delete "B4C" and insert -- $B_4C$ -- therefor Column 2, Line 57: delete "$Mo_xSiy$-Si" and insert -- $Mo_xSi_y$—Si -- therefor Column 3, Line 2: delete "pm," and insert -- μm, -- therefor Column 3, line 4: delete "S 500" and insert -- ≤500 -- therefor Column 3, Line 6: delete "10 ps," and insert -- ≤10 μs, -- therefor Column 3, Line 59-60: delete "high-energy secondary electrodes" and insert -- high-energy secondary electrons -- therefor Column 4, Line 18: delete "AI," and insert -- A1, -- therefor Signed and Sealed this
Twenty-third Day of October, 2012

David J. Kappos
*Director of the United States Patent and Trademark Office*

UNITED STATES PATENT AND TRADEMARK OFFICE
CERTIFICATE OF CORRECTION

PATENT NO. : 8,164,077 B2
APPLICATION NO. : 12/625336
DATED : April 24, 2012
INVENTOR(S) : Marco Wedowski et al.

It is certified that error appears in the above-identified patent and that said Letters Patent is hereby corrected as shown below:

In the Specification:

Column 6, Line 64: delete "screen elements 106" and insert -- screen elements 105 --

Column 6, Line 64: delete "pupil facet mirror 106" and insert -- pupil facet mirror 105 --

Signed and Sealed this
Twenty-seventh Day of May, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,164,077 B2
APPLICATION NO. : 12/625336
DATED : April 24, 2012
INVENTOR(S) : Marco Wedowski et al.

It is certified that error appears in the above-identified patent and that said Letters Patent is hereby corrected as shown below:

In the Specification:

Column 5, Line 7: delete "($y_i$, y2)" and insert -- ($\gamma_1$, $\gamma_2$) --, therefor Column 5, Line 9: delete "y," and insert -- $\gamma_1$ --, therefor Column 5, Line 9: delete "e'," and insert -- $e^-_1$, --, therefor Column 5, Line 10: delete "e'2" and insert -- $e^-_2$ --, therefor Column 5, Line 11: delete "e'2" and insert -- $e^-_2$ --, therefor Column 5, Line 14: delete "e'1" and insert -- $e^-_1$ --, therefor Column 5, Line 15: delete "electrode, which is" and insert -- electrode is --, therefor Column 5, Line 16: delete "first capacitor electrode 26" and insert -- first capacitor electrode 25 --, therefor Column 5, Line 17: delete "e'1 and e'2," and insert -- $e^-_1$ and $e^-_2$, --, therefor Column 5, Line 21: delete "y2" and insert -- $\gamma_2$ --, therefor Column 5, Line 38: delete "or a negative" and insert -- or at a negative --, therefor Column 5, Line 50: delete "Cl" and insert -- $C_1$ --, therefor Column 5, Line 53: delete "C2" and insert -- $C_2$ --, therefor Column 5, Line 56: delete "C2" and insert -- $C_2$ --, therefor Column 5, Line 57: delete "Cl" and insert -- $C_1$ --, therefor Column 5, Line 60: delete "C2" and insert -- $C_2$ --, therefor Signed and Sealed this
Fifth Day of August, 2014

Michelle K. Lee
*Deputy Director of the United States Patent and Trademark Office*

CERTIFICATE OF CORRECTION (continued)
U.S. Pat. No. 8,164,077 B2

Column 5, Line 61: delete "CI." and insert -- $C_1.$ --, therefor

Column 5, Line 63: delete "CI" and insert -- $C_1$ --, therefor

Column 5, Line 65: delete "C2" and insert -- $C_2$ --, therefor

Column 5, Line 66: delete "C2" and insert -- $C_2$ --, therefor

Column 6, Line 4: delete "CI" and insert -- $C_1$ --, therefor

Column 6, Line 5: delete "C2" and insert -- $C_2$ --, therefor

Column 6, Line 8: delete "CI" and insert -- $C_1$ --, therefor

Column 6, Line 18: delete "C2" and insert -- $C_2$ --, therefor

Column 6, Line 21: delete "C2" and insert -- $C_2$ --, therefor

Column 7, Line 52 (approx): delete "31 a-d" and insert -- 31a-d --, therefor

Column 8, Line 24: delete "CI" and insert -- $C_1$ --, therefor

Column 8, Line 25: delete "C2" and insert -- $C_2$ --, therefor